US 6,815,289 B2

United States Patent
Hirano et al.

(10) Patent No.: US 6,815,289 B2
(45) Date of Patent: Nov. 9, 2004

(54) METHOD OF MANUFACTURING SEMICONDUCTOR DEVICE

(75) Inventors: Tomoyuki Hirano, Kanagawa (JP); Kazumi Asada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/041,791

(22) Filed: Oct. 19, 2001

(65) Prior Publication Data
US 2002/0098646 A1 Jul. 25, 2002

(30) Foreign Application Priority Data
Oct. 19, 2000 (JP) .................................... P2000-319402

(51) Int. Cl.$^7$ .................................................. H01L 21/8242
(52) U.S. Cl. ........................ 438/255; 438/398; 438/665; 438/906; 438/266
(58) Field of Search ................ 438/257–267, 438/255, 665, 906, 398

(56) References Cited

U.S. PATENT DOCUMENTS

| 5,494,841 | A | * | 2/1996 | Dennison et al. | ........... | 438/210 |
| 5,767,005 | A | * | 6/1998 | Doan et al. | ................ | 438/593 |
| 6,010,942 | A | * | 1/2000 | Chien et al. | ................ | 438/396 |
| 6,100,203 | A | * | 8/2000 | Kil et al. | ..................... | 438/745 |
| 6,153,465 | A | * | 11/2000 | Jenq et al. | .................. | 438/255 |
| 6,165,841 | A | * | 12/2000 | Kim et al. | ................... | 438/255 |
| 6,232,178 | B1 | * | 5/2001 | Yamamoto | ................... | 438/255 |
| 2002/0024086 | A1 | * | 2/2002 | Yates et al. | .................. | 257/309 |

FOREIGN PATENT DOCUMENTS

| JP | 08306646 A | * | 11/1996 |
| JP | 11274097 A | * | 10/1999 |
| JP | 2000174208 A | * | 6/2000 |

OTHER PUBLICATIONS

Ghandhi, "VLSI Fabrication Principles Silicon and Gallium Arsenide", John Wiley & Sons, 1994, pp. 639–649.*

* cited by examiner

Primary Examiner—Richard A. Booth
(74) Attorney, Agent, or Firm—Sonnenschein, Nath & Rosenthal LLP

(57) ABSTRACT

Provided is a method of manufacturing a semiconductor device capable of effectively removing impurity product attached to a semiconductor film while suppressing coming off of, for example, hemispherical grains formed on a semiconductor film containing an impurity. Spherical or hemispherical grains are formed on the surface of an amorphous silicon film containing phosphorus which forms a bottom electrode of a capacitor. In order to suppress depletion of the bottom electrode, annealing is performed in $PH_3$ atmosphere so as to diffuse phosphorus to the grains. Cleaning is performed using hot water (deionized water) in order to remove the impurity product attached onto the surface of the bottom electrode by annealing. A native oxide film formed on the surface of the bottom electrode is removed by cleaning using a mixed solution of hydrofluoric acid and water. A dielectric film and a top electrode are formed in order so as to cover the surface of the bottom electrode. Thereby, a cylindrical capacitor is fabricated.

15 Claims, 8 Drawing Sheets

METHOD OF MANUFACTURING SEMICONDUCTOR DEVICE

RELATED APPLICATION DATA

The present application claims priority to Japanese Application(s) No(s). P2000-319402 filed Oct. 19, 2000, which application(s) is/are incorporated herein by reference to the extent permitted by law.

BACKGROUND OF THE INVENTION

1. Field of the Invention

The present invention relates to a method of manufacturing a semiconductor device for fabricating a cylindrical capacitor and the like.

2. Description of the Related Art

Currently, in memories such as DRAM (Dynamic Random Access Memory), a capacitor is used as a device for storing information. The occupied area of the capacitor in each memory cell of the memory has reduced in accordance with high integration of semiconductor integrated circuits. As a result, capacitance of a capacitor is decreased. However, for the capacitor to sufficiently function as a memory cell, it is necessary to ensure constant capacitance. Also, in order to obtain a sufficient margin for soft errors or noises due to alpha ($\alpha$) ray emitted from the package and cover which accommodate the memory, it is necessary to further increase the capacitance. Therefore, in order to increase the capacitance of capacitors, a method of using a ferroelectric film with high permittivity, a method of increasing the electrode area of capacitors, and the like are proposed.

One of the methods of increasing the electrode area of the capacitor employs an HSG (Hemispherical Grain) film for electrodes (disclosed in for example, Japanese Patent Application Laid-open Hei 8-306646). In the method, first, silane ($SiH_4$) is irradiated (supplied) to an amorphous silicon film, which is an amorphous semiconductor film containing an impurity, used for a bottom electrode of a capacitor to form crystal nuclei on the surface thereof. Then, annealing is performed so that the silicon atoms on the surface of the amorphous silicon film are migrated towards the formed crystal nuclei. Thereby, HSG-Si (Hemispherical Grained Silicon) is formed on the surface of the amorphous silicon film. After forming the HSG film as described, annealing is performed in, for example, phosphine ($PH_3$) atmosphere in order to suppress depletion. As a result, phosphorus (P), which is an impurity, is diffused to the hemispherical grain, thereby forming the bottom electrode of a capacitor. Then, a dielectric film (for example, a nitride film) and a top electrode are formed in order for fabricating a capacitor.

In the above-described method of the related art, a phosphorus compound, which is a phosphorus product generated by annealing in $PH_3$ atmosphere, is attached to the silicon film. Therefore, cleaning is performed for removing the phosphorus compound through etching using SC1 (a mixed solution of ammonium hydroxide ($NH_4OH$) and hydrogen peroxide ($H_2O_2$)) as a cleaning solution. Then, in order to remove native oxide and the like, cleaning is performed through etching using dilute hydrofluoric acid (DHF). However, when SC1 is used, the hemispherical grains come off by etching. This results in the decrease of the electrode area and short circuit in the bottom electrodes of the adjacent capacitors. In the case where cleaning is performed using dilute hydrofluoric acid instead of using SC1 in order to avoid these problems, a cleaning tank of hydrofluoric acid is contaminated by the phosphorus compound.

SUMARRY OF THE INVENTION

The invention has been designed to overcome the foregoing problems. An object of the invention is to provide a method of manufacturing a semiconductor device capable of effectively removing impurity products attached to a semiconductor film while suppressing coming off of, for example, hemispherical grains as much as possible formed on the semiconductor film containing an impurity.

A method of manufacturing a semiconductor device of the invention comprises the steps of: forming a semiconductor film on a substrate and then growing spherical or hemispherical grains on the surface of the semiconductor film; diffusing an impurity to the grains grown on the surface of the semiconductor film; and removing the impurity product, which is generated in the step of diffusing the impurity, from the surface of the semiconductor film using hot water.

Another method of manufacturing a semiconductor device of the invention comprises the steps of: forming a semiconductor film on a substrate and then growing spherical or hemispherical grains on the surface of the semiconductor film; diffusing an impurity to the grains grown on the surface of the semiconductor film; and removing the impurity product, which is generated in the step of diffusing the impurity, from the surface of the semiconductor film using either a mixed solution of hydrochloric acid and hydrogen peroxide or a mixed solution of sulfuric acid and hydrogen peroxide.

In a method of manufacturing a semiconductor device of the invention, spherical or hemispherical grains are formed on the surface of a semiconductor device on a substrate. Then, an impurity is diffused to the grains grown on the surface of the semiconductor film. The impurity product, which is generated in the step of diffusing the impurity, is removed from the surface of the semiconductor film using either hot water, a mixed solution of hydrochloric acid and hydrogen peroxide or a mixed solution of sulfuric acid and hydrogen peroxide.

Other and further objects, features and advantages of the invention will appear more fully from the following description.

DETAILED DESCRIPTION OF THE PREFERRED EMBODIMENT

Figure 1A:
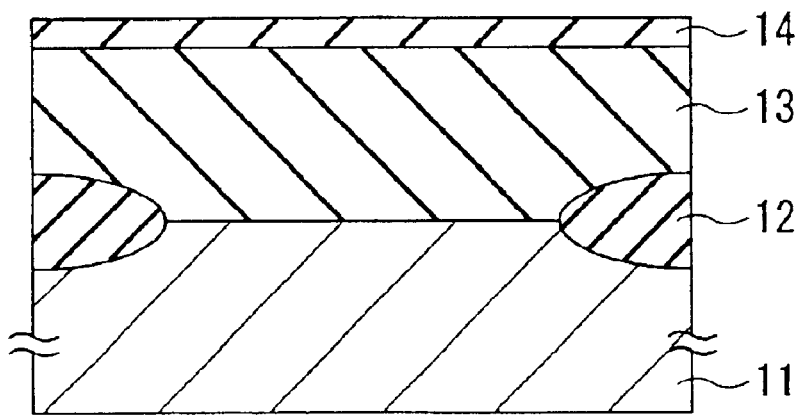
FIGS. 1A to 1C are cross sections for describing a method of manufacturing a cylindrical capacitor as a semiconductor device according to an embodiment of the invention.

In the followings, an embodiment of the invention will be described in detail by referring to the drawings.

FIGS. 1A, 1B and 1C to FIGS. 4A and 4B are for describing a method of manufacturing a cylindrical capacitor as a semiconductor device according to an embodiment of the invention. First, as shown in FIG. 1A, on a semiconductor substrate (wafer) 11 such as a silicon substrate, a field oxide film 12 for separating the substrate into an active region and a field region, an interlayer insulating film 13, and a nitride silicon film 14 having a thickness of, for example, 100 nm serving as an etching stopper for removing a cylinder core layer 16 to be described later by etching are formed in order.

Figure 1B:
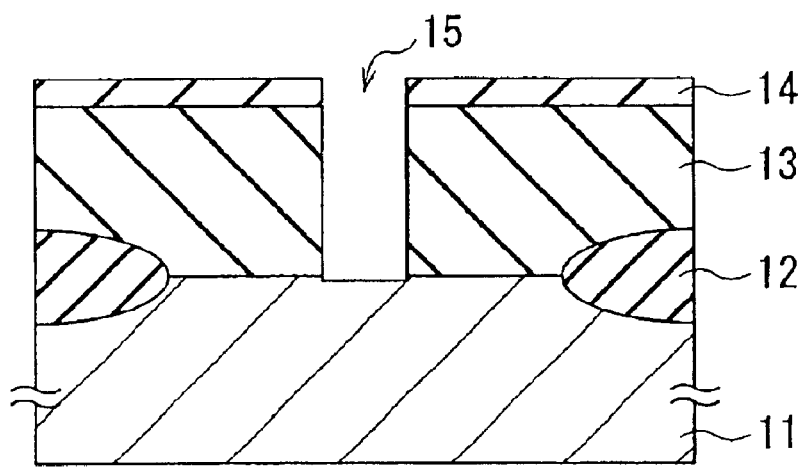
Figure 1C:
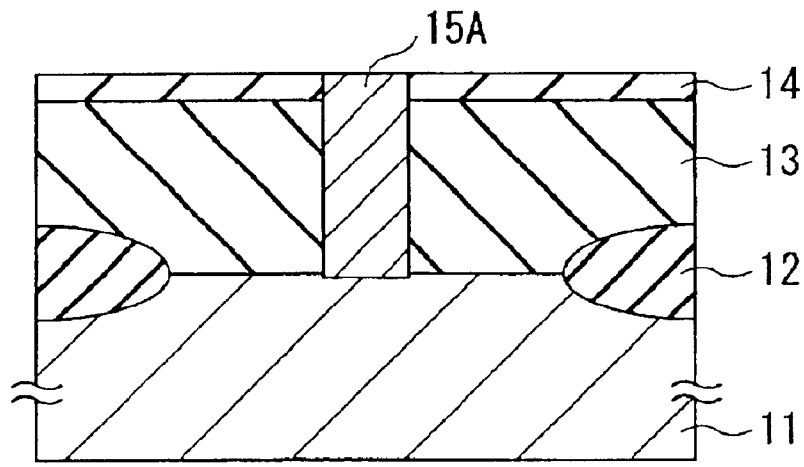

Next, as shown in FIG. 1B, a contact hole 15 reaching the semiconductor substrate 11 is formed by performing anisotropic etching on the nitride silicon film 14 and the interlayer insulating film 13 using a resist (not shown in the figure) with a predetermined pattern as a mask. Then as shown in FIG. 1C, a conductive film made of, for example, amorphous silicon or polysilicon containing phosphorus is formed over the entire surface including the contact hole 15. A contact electrode 15a adjacent to the active region of the semiconductor substrate 11 is formed by CMP (Chemical Mechanical Polishing) or isotropic etching.

Figure 2A:
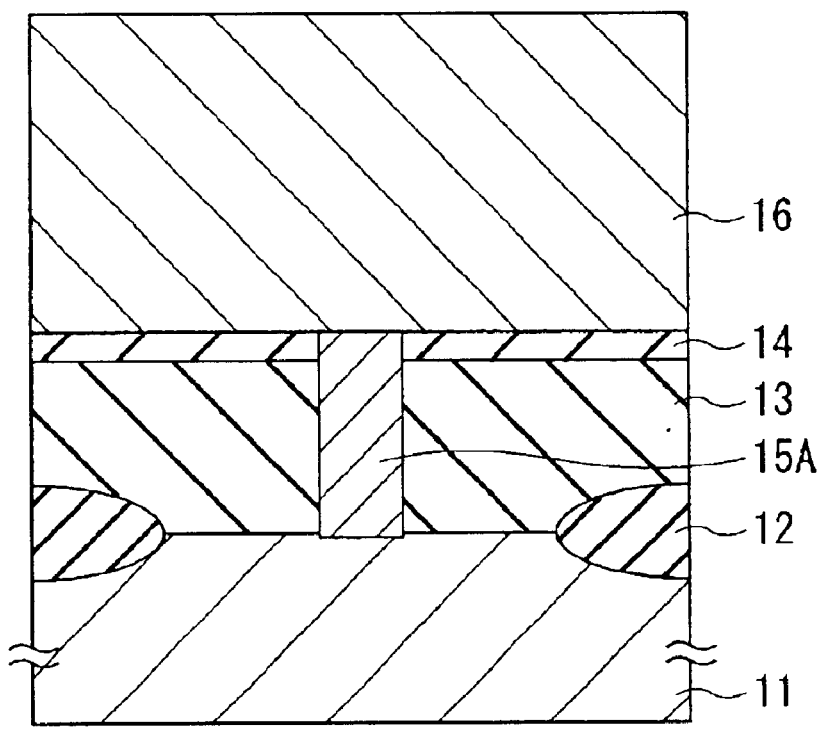
FIGS. 2A and 2B are cross sections for describing the steps following the steps shown in FIGS. 1A to 1C.
Figure 2B:
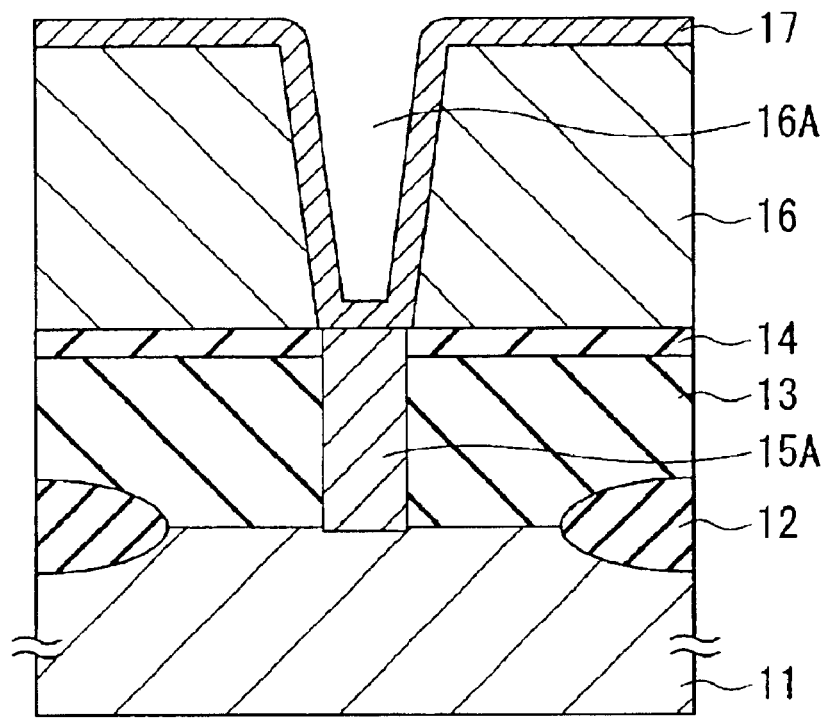

Next, as shown in FIG. 2A, the cylinder core layer 16 of about 1000 nm thick made of a silicon oxide film material such as BPSG (Boronphosphosilicate Glass) is formed over the surface of the nitride silicon film 14 and the upper part of the contact electrode 15A. As shown in FIG. 2B, the cylinder core layer 16 is patterned by etching using a resist (not shown in the figure) with a predetermined pattern so as to expose the upper part of the contact electrode 15A. With this state, an amorphous silicon film 17 having a thickness of, for example, 100 nm as an amorphous semiconductor film containing an impurity (for example, phosphorus) is formed so as to cover not only the top surface of the cylinder core layer 16 but also the internal wall surface of a patterned portion 16A.

Figure 3A:
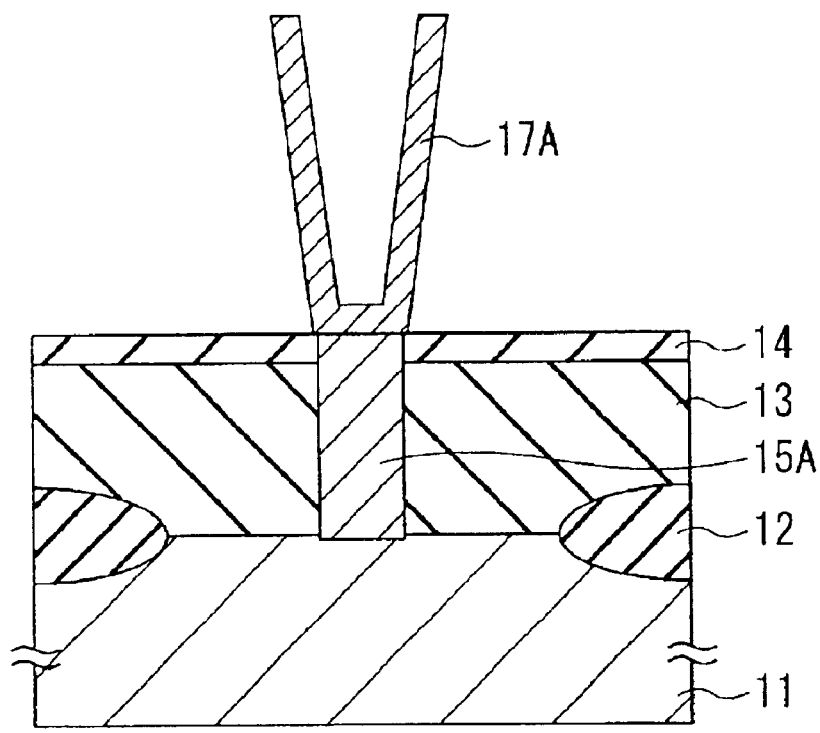
FIGS. 3A and 3B are cross sections for describing the steps following the steps shown in FIGS. 2A and 2B.

The amorphous silicon film 17 formed on the top surface of the cylinder core layer 16 is removed by CMP leaving only the amorphous silicon film 17 formed in the internal wall surface of the patterned portion 16A. Then, as shown in FIG. 3A, the cylinder core layer 16 is selectively removed by wet etching using an etching solution containing dilute hydrofluoric acid to form a cylindrical bottom electrode 17A for forming a capacitor. The interlayer insulating film 13 is covered with the nitride silicon film 14 so that it is not exposed under the influence of etching.

Figure 3B:
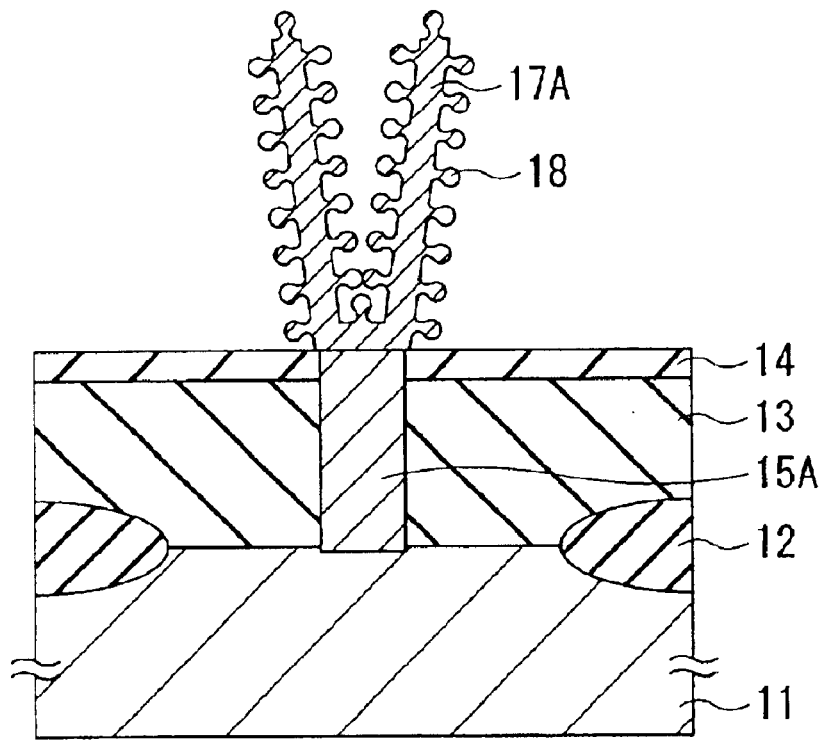

The crystal nuclei are selectively formed on the surface of the bottom electrode 17A by introducing silane ($SiH_4$) gas or disilane ($Si_2H_6$) gas into a reaction chamber (not shown in the figure). Then, gas introduction is stopped and annealing is performed under ultrahigh vacuum pressure (for example, $5 \times 10^{-6}$ Pa) or in an inert gas atmosphere (for example, $N_2$ gas). Thereby, as shown in FIG. 3B, a number of spherical or hemispherical grains 18 are formed on the surface of the bottom electrode 17A with the formed crystal nuclei being the center. The diameter of one grain 18 lies within the range of 30 nm to 40 nm. Then, annealing is performed in $PH_3$ atmosphere in order to suppress depletion of the bottom electrode 17A. The annealing temperature lies within the range of, for example, 650° C. to 750° C. and the annealing time lies within the range of 30 minutes to 120 minutes. Phosphorus is diffused to the grains 18 through the annealing.

Figure 4A:
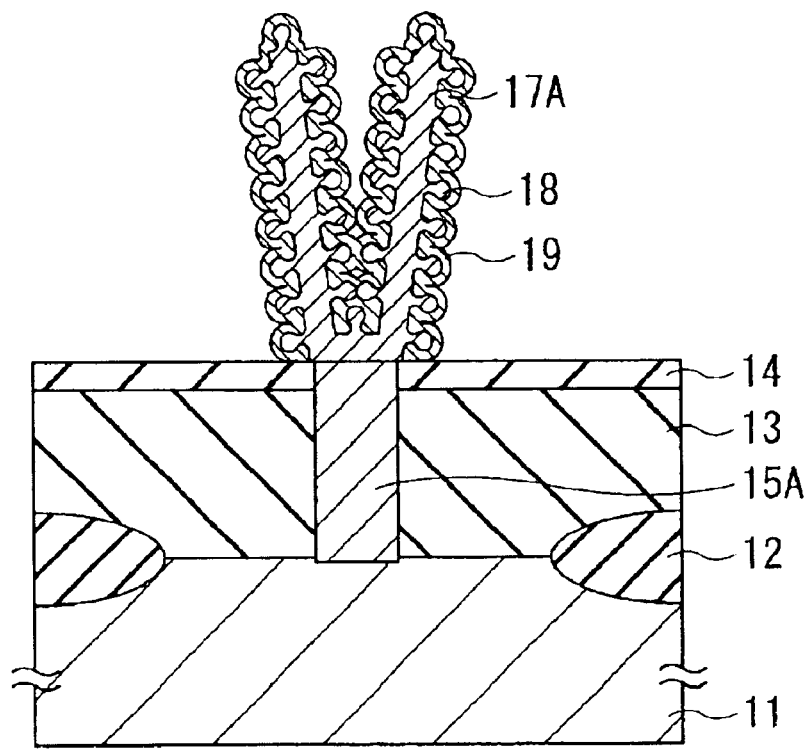
FIGS. 4A and 4B are cross sections for describing the steps following the steps shown in FIGS. 3A and 3B.
Figure 4B:
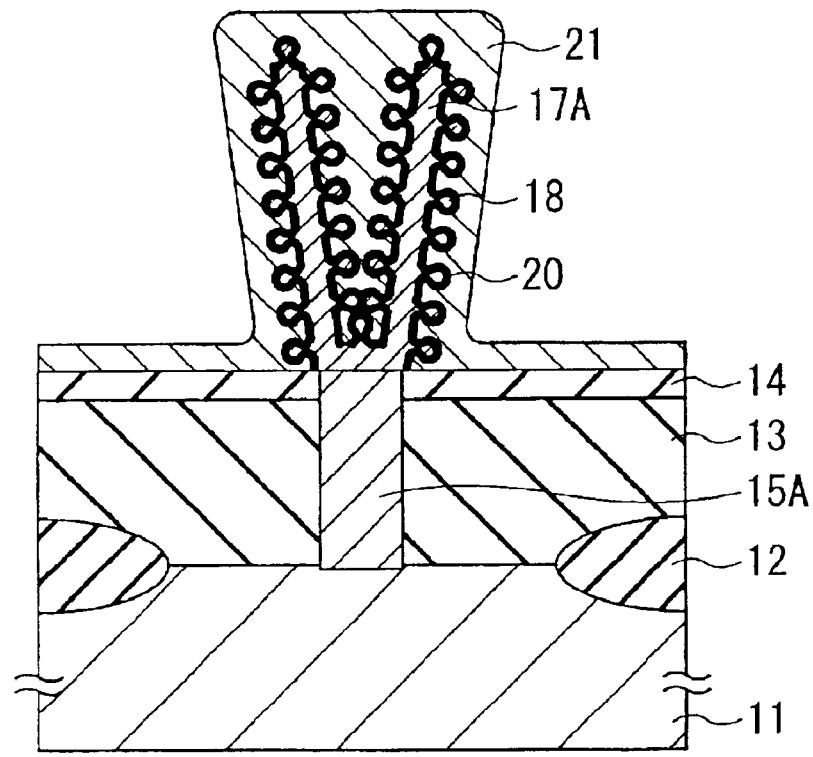

As shown in FIG. 4A, an impurity product 19 such as phosphorus compound is attached on the surface of the bottom electrode 17A by the above-mentioned annealing in $PH_3$ atmosphere. Therefore, only the impurity product 19 is removed by cleaning using a cleaning solution which does not etch the bottom electrode 17A. At this time, hot water (for example, DIW (Deionized Water) of 60° C.) is used as the cleaning solution. Then, a native oxide film formed on the surface of the bottom electrode 17A is removed by cleaning through soaking it in an HF tank with a mixed solution of hydrofluoric acid (HF) and water ($H_2O$) where the mixing ratio of HF and $H_2O$ is, for example, 1:200. After such cleaning on the bottom electrode 17A, as shown in FIG. 4B, a dielectric film 20 such as a nitride film is formed so as to cover the surface of the bottom electrode 17A. A top electrode 21 made of, for example, an amorphous silicon film containing an impurity (phosphorus or the like) is formed so as to cover the dielectric film 20. Thereby, a cylindrical capacitor is fabricated.

A number of capacitors fabricated as described are arranged adjacent to each other on a wafer.

Figure 5:
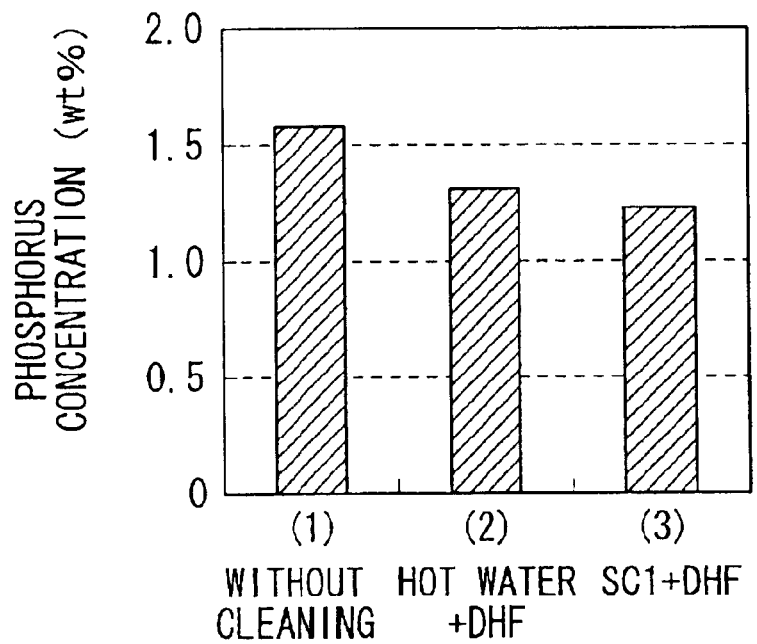
FIG. 5 shows the result obtained by measuring the phosphorus concentration in a cleaned bottom electrode.

In order to study the cleaning effect obtained by the above-mentioned cleaning, the phosphorus concentration in the bottom electrode 17A was measured by XRF (X-ray Fluorescence) analysis in the following three cases. Cleaning was not performed in case (1), the above-mentioned cleaning was performed in case (2), and conventional cleaning was performed in case (3). FIG. 5 shows the result of the measurement. In FIG. 5, the vertical axis represents the phosphorus concentration (wt %). When performing conventional cleaning, SC1 and DHF were used as the cleaning solution. As can be seen from FIG. 5, in the case (2), compared to the case (1), the phosphorus concentration in the bottom electrode 17A is decreased as in the case (3), and the impurity product 19 is removed from the surface of the bottom electrode 17A. Therefore, by performing cleaning using hot water, it becomes possible to suppress contamination of the HF tank for removing the native oxide by the impurity product 19 as much as possible.

Figure 6:
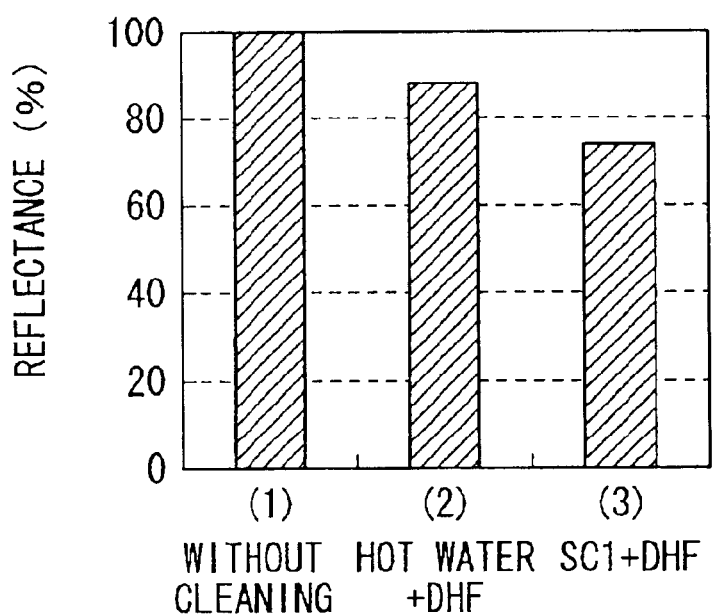
FIG. 6 shows the result obtained by measuring the reflectance in the surface of a cleaned bottom electrode.

Also, reflectance of the surface of the bottom electrode 17A in each of the above-mentioned cases (1) to (3) was measured using a general reflectometer. FIG. 6 shows the result. The changes in the reflectance substantially correspond to the size and the number of the grains 18 formed on the surface of the bottom electrode 17A. The vertical axis represents the reflectance (%) provided the reflectance in the case (1) is 100%. As can be seen from FIG. 6, the reflectance in the case (2) is larger compared to the case (3), and the difference in the reflectance between the case (2) and the case (1) is small. This exhibits the size and the number of the grains 18 remained on the surface of the bottom electrode 17A in the case (2) are larger than those in the case (3). As a result, it was verified that the grains 18 were hard to be come off in the case (2). Therefore, it becomes possible to suppress decrease in the electrode area of the bottom electrode 17A and decrease in the capacitance of the capacitor as much as possible.

Figure 7:
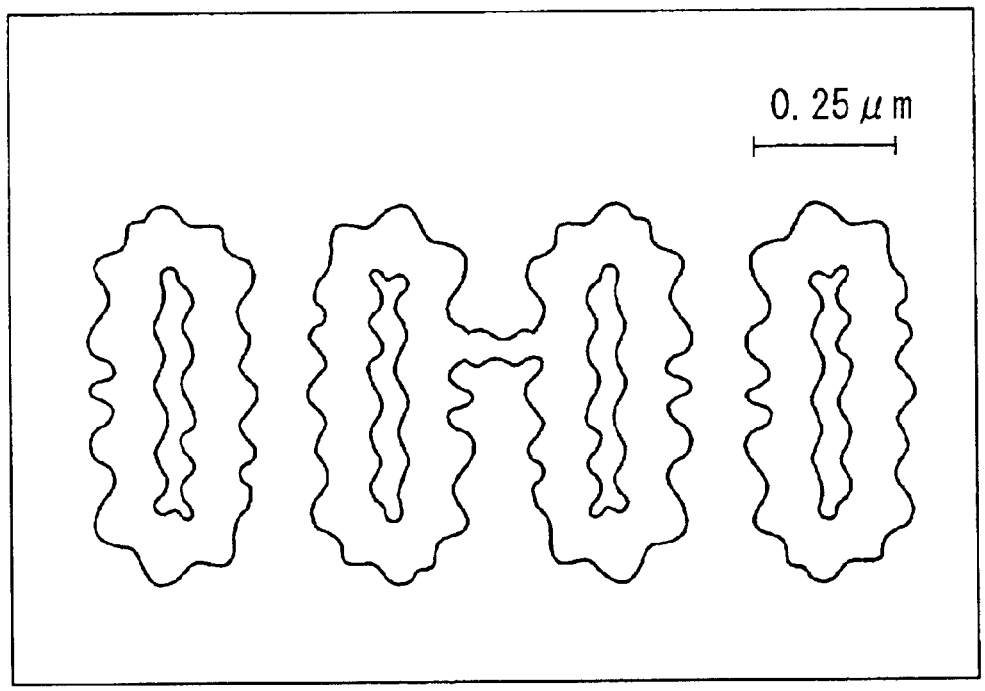
FIG. 7 is a view of SEM picture of the defects formed between the adjacent bottom electrodes on a wafer.
Figure 8:
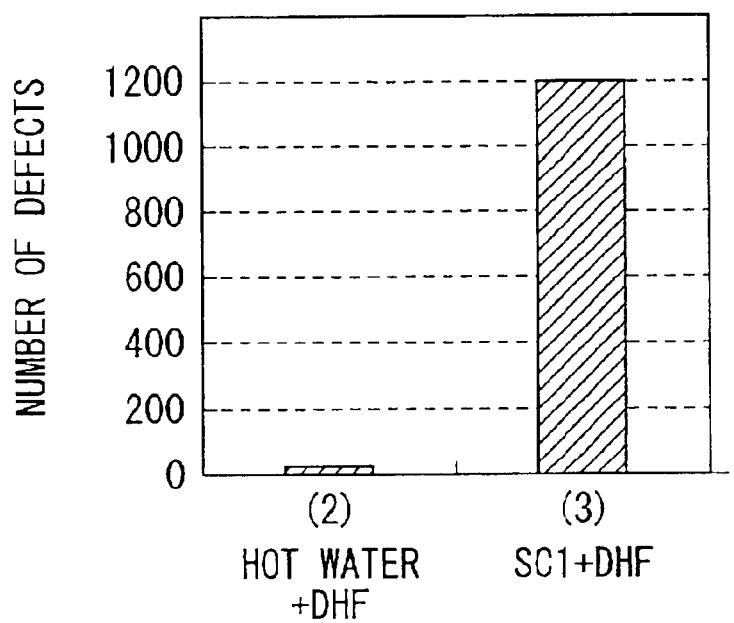
FIG. 8 shows the result obtained by detecting the number of defects formed between the adjacent bottom electrodes on a wafer.

FIG. 7 is the view of the picture taken by SEM (Scanning Electron Microscope) showing the portion of short-circuit (defect) generated between a plurality of adjacent bottom electrodes formed on a wafer due to coming off of the grains 18 from the surface of the bottom electrode 17A in the above-mentioned case (2) or (3) from the above. In FIG. 7, the defects are generated in the center portion. The defects generated between the adjacent bottom electrodes in the above-mentioned cases (2) and (3) were detected by a defect detector. FIG. 8 shows the result. The vertical axis represents the number of defects in the surface of one wafer. As can bee seen from FIG. 8, the number of defects in the case (2) is largely decreased compared to those in the case (3). Therefore, short-circuit between the bottom electrodes in the capacitor formed adjacent to each other can be suppressed as much as possible and a capacitor with high reliability can be fabricated.

Figure 9:
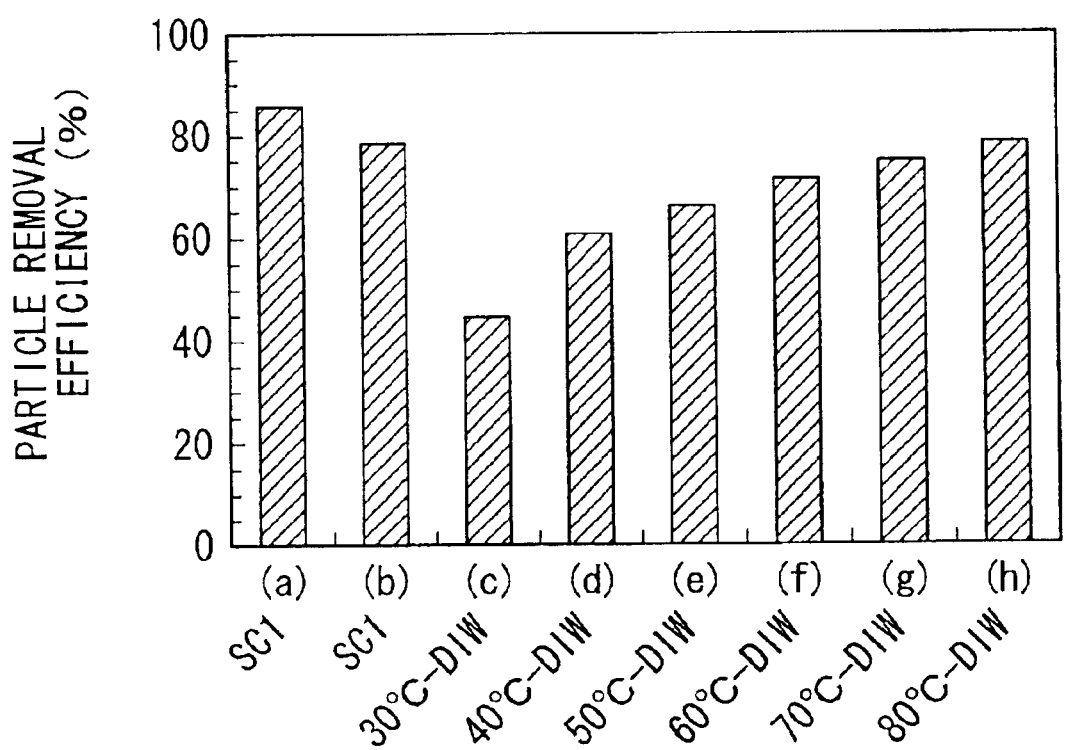
FIG. 9 is a figure showing the particle removal efficiency in a bottom electrode which is cleaned using a cleaning solution at different temperatures.

In the above-mentioned cleaning, deionized water of 60° C. was used as the cleaning solution. Removal efficiency of particles containing the impurity product of the bottom electrode was measured by a particle counter in the case where cleaning was performed by varying the temperatures of the deionized water. FIG. 9 shows the result of the measurement. The vertical axis represents particle removal efficiency (%). In the horizontal axis, (a) shows the case where SC1 of about 60° C. was used as the cleaning solution and (b) shows the case where SC1 of about 30° C. was used. Also, (c) to (h) show the cases where deionized water of different temperatures (30° C., 40° C., 50° C., 60° C., 70° C., 80° C.) were used. As can be seen from FIG. 9, the particle removal efficiency increases in accordance with the increase in the temperature of deionized water. However, the boiling point of deionized water is at 100° C. so that bubbles are generated in the deionized water when the temperature becomes higher than, for example, 80° C., and the particles attached to the bubbles by electrification may reattached to the wafer. Also, a flow necessary to obtain a desired cleaning effect cannot be ensured since the flow supply of deionized water decreases as the temperature increases due to the capacity of a water heater for increasing the temperature of the deionized water. In general, the flow is 20 (liter/minute). However, at 70° C. or above, it was decreased to several litter/minute. In the case where the temperature of the deionized water was increased from 30° C. to 40° C., the ratio of increase in the particle removal efficiency is larger compared to the cases thereafter. Therefore, as the temperature of the deionized water used as the cleaning solution, it is preferable that the temperature is 80° C. or below, especially within the range of 30° C. to 80° C., and is more preferable to be within the range of 40° C. to 80° C.

In the above-mentioned cleaning, deionized water was used as the cleaning solution. Instead of using deionized water, a mixed solution of sulfuric acid ($H_2SO_4$) and hydrogen peroxide ($H_2O_2$) where the mixing ratio was, for example, 1:5 was used for cleaning the bottom electrode and the phosphorus concentration, reflectance and the number of defects were measured (detected). Also, in this case, the same results as in the case (2) was obtained. Therefore, it was verified that such mixed solution was also effective for cleaning the bottom electrode.

Also, a mixed aqueous solution of hydrochloric acid (HCl) and hydrogen peroxide ($H_2O_2$) where the mixing ratio of HCl: $H_2O_2$: $H_2O$ was, for example, 1:1:8 was used for cleaning the bottom electrode and the phosphorus concentration, reflectance and the number of defects were measured. Also, in this case, the same results as in the case (2) was obtained. Therefore, it was verified that such mixed solution was also effective for cleaning the bottom electrode.

As described, in the embodiment, the impurity product attached to the bottom electrode of the capacitor in the step of diffusing an impurity by forming spherical or hemispherical grains is removed by cleaning using hot water. As a result, decrease in the capacitance of the capacitor due to coming off of the grains can be suppressed. Also, short-circuit (defect) between the adjacent bottom electrodes due to coming off of the grains can be suppressed as much as possible. Therefore, it becomes possible to fabricate a capacitor with high reliability.

In the above-mentioned embodiment, a method of cleaning when forming the bottom electrode of a cylindrical capacitor is described. However, the invention is not limited to this but also applicable when manufacturing other semiconductor device such as so-called a floating-gate nonvolatile memory.

Figure 10A:
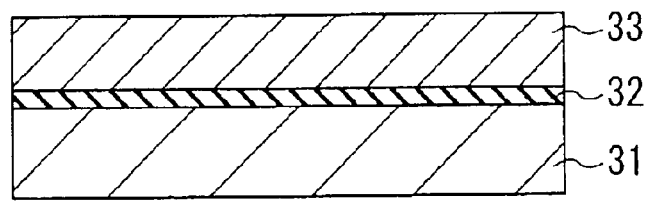
FIGS. 10A to 10E are cross sections for describing a method of manufacturing a floating-gate nonvolatile memory as a semiconductor device according to another embodiment of the invention.
Figure 10B:
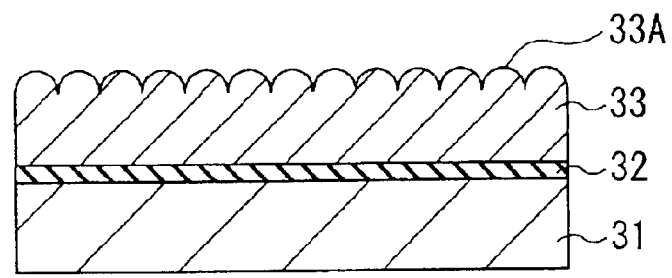
Figure 10C:
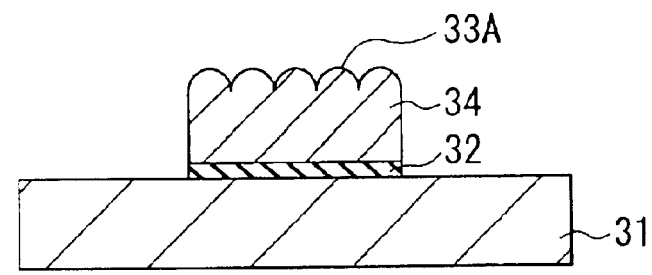

FIGS. 10A to 10E are for describing a method of manufacturing a floating-gate nonvolatile memory. First, as shown in FIG. 10A, a first insulating film 32 of 10 nm thick, which is made of silicon oxide ($SiO_2$), is formed on a semiconductor substrate 31 made of p-type single crystal by thermal oxidation. On the first insulating film 32, an amorphous silicon film of 150 nm thick containing phosphorus is formed as a first conductive film 33 by LPCVD (Low Pressure Chemical Vapor Deposition). When forming the film, for example, the deposition temperature is 530° C. and the deposition gas is $SiH_4$. As shown in FIG. 10B, spherical or hemispherical grains 33A are formed on the surface of the first conductive film 33 by irradiating (supplying) $SiH_4$ and annealing at 560° C. on the first conductive film 33. With this state, phosphorus is doped onto the grains 33A by annealing in $PH_3$ atmosphere. After the doping, the first insulating film 32 and the first conductive film 33 are selectively etched using a predetermined photoresist (not shown in the figure) as a mask. Thereby, a floating-gate electrode 34 is formed as shown in FIG. 10C.

Figure 10D:
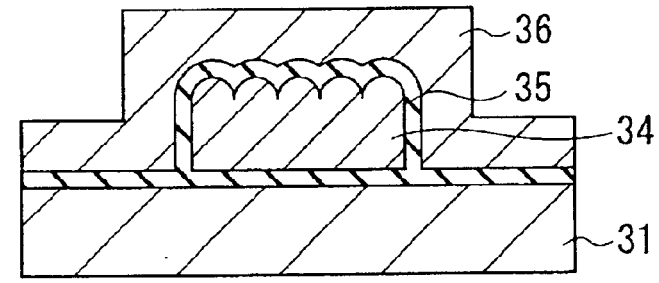
Figure 10E:
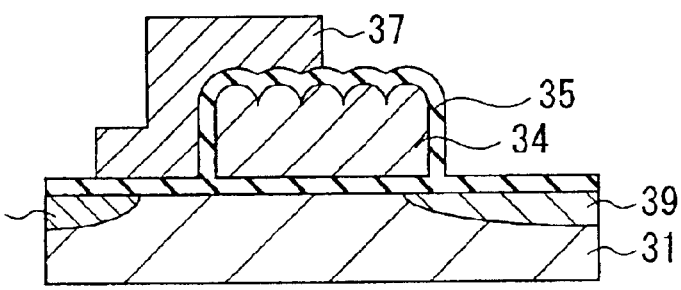

Then, cleaning is performed using hot water (for example, deionized water of 60° C.). After the cleaning, a second insulating film 35 made of $SiO_2$ is formed by thermal oxidation or CVD. Then, after forming a polysilicon film of 100 nm thick on the second insulating film 35 by LPCVD, phosphorus is doped onto the polysilicon film. Thereby, a second conductive film 36 is obtained as shown in FIG. 10D.

The second conductive film 36 is selectively etched using a predetermined photoresist (not shown in the figure) as a mask so that the film remains in part of the upper portion and one side of the floating-gate electrode 34. Thereby, a control-gate electrode 37 is formed. Using the floating-gate electrode 34 and the control-gate electrode 37 as a mask, an n-type impurity such as arsenic or phosphorus is ion-implanted to the semiconductor substrate 31. Thereby, as shown in FIG. 1E, an n-type drain region 38 and an n-type source region 39 are formed. Then annealing is performed so as to activate the implanted ions. Thereby, a floating-gate nonvolatile memory is manufactured.

As described, in the case of manufacturing a floating-gate nonvolatile memory, cleaning using hot water is performed on the floating-gate electrode 34 on which grains 33A are formed. Therefore, by the cleaning, the impurity product can be removed while suppressing decrease in the surface area of the floating-gate electrode 34 due to coming off of the grains 33A.

The invention has been described by referring to the embodiment. However, the invention is not limited to the above-mentioned embodiment but various kinds of modifications are possible. For example, in the above-mentioned embodiment, phosphorus is used as an impurity contained in an amorphous silicon film as the bottom electrode. However, it is also possible to use arsenic. Also, the invention is applicable to devices other than the capacitor and memory.

As described, in a method of manufacturing a semiconductor device of the invention, spherical or hemispherical grains are grown on the surface of a semiconductor film on a substrate. Then, an impurity is diffused to the grains. The impurity product generated in the step of diffusing the impurity is removed from the surface of the semiconductor film using hot water, a mixed solution of hydrochloric acid and hydrogen peroxide or a mixed solution of sulfuric acid and hydrogen peroxide. Therefore, the impurity product can be effectively removed while suppressing coming off of the grains from the semiconductor film as much as possible.

Obviously many modifications and variations of the present invention are possible in the light of above teachings. It is therefore to be understood that within the scope of the appended claims the invention may be practiced otherwise than as specifically described.

What is claimed is:

1. A method of manufacturing a semiconductor device comprising:

growing spherical or hemispherical grains on a semiconductor film;

diffusing an impurity product to the grains;

removing the impurity product, from the semiconductor film using a first cleaner selected from the group consisting of: 1) hot water, 2) a mixed solution of water, hydrochloric acid and hydrogen peroxide, and 3) a mixed solution of sulfuric acid and hydrogen peroxide; and removing native oxide on the semiconductor film using a second cleaner.

2. A method of manufacturing a semiconductor device as claimed in claim 1, wherein the semiconductor film is formed of a silicon material and phosphorus or arsenic is used as the impurity product.

3. A method of manufacturing a semiconductor device as claimed in claim 1, wherein deionized water is used for the hot water.

4. A method of manufacturing a semiconductor device as claimed in claim 1, wherein the temperature of the hot water lies within the range of 30° C. to 80° C.

5. A method of manufacturing a semiconductor device as claimed in claim 1, wherein the semiconductor film which contains the impurity product and the grains formed thereon are used as one of electrodes of a capacitor.

6. A method of manufacturing a semiconductor device as claimed in claim 1, wherein the native oxide is removed using a mixed solution of hydrofluoric acid and deionized water.

7. A method of manufacturing a semiconductor device as claimed in claim 5, wherein the capacitor is a cylindrical capacitor.

8. A method of manufacturing a semiconductor device comprising:

removing an impurity product diffused into spherical or hemispherical grains formed on a semiconductor film using a first cleaner selected from the group consisting of: 1) hot water, 2) a mixed solution of water, hydrochloric acid and hydrogen peroxide, and 3) a mixed solution of sulfuric acid and hydrogen peroxide; and removing native oxide from the semiconductor film using a second cleaner.

9. A method of manufacturing a semiconductor device as claimed in claim 8, wherein the semiconductor film is formed of a silicon material and phosphorus or arsenic is used as the impurity product.

10. A method of manufacturing a semiconductor device as claimed in claim 8, wherein deionized water is used for the hot water.

11. A method of manufacturing a semiconductor device as claimed in claim 8, wherein the temperature of the hot water lies within the range of 30° C. to 80° C.

12. A method of manufacturing a semiconductor device as claimed in claim 8, wherein the semiconductor film which contains the impurity product and the grains formed thereon are used as one of electrodes of a capacitor.

13. A method of manufacturing a semiconductor device as claimed in claim 12, wherein the capacitor is a cylindrical capacitor.

14. A method of manufacturing a semiconductor device as claimed in claim 8, wherein the native oxide is removed using a mixed solution of hydrofluoric acid and deionized water.

15. A method of manufacturing a semiconductor device as claimed in claim 8, wherein the removing of the native oxide is after the removing of the impurity product.

* * * * *